(12) United States Patent
Baik et al.

(10) Patent No.: US 12,009,557 B2
(45) Date of Patent: Jun. 11, 2024

(54) RECOVERY CONTROL SYSTEM OF FUEL CELL AND METHOD THEREOF

(71) Applicants: Hyundai Motor Company, Seoul (KR); Kia Corporatoin

(72) Inventors: Seung Won Baik, Gyeonggi-do (KR); Ki Chang Kim, Seoul (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 18 days.

(21) Appl. No.: 17/894,218

(22) Filed: Aug. 24, 2022

(65) Prior Publication Data
US 2023/0197989 A1 Jun. 22, 2023

(30) Foreign Application Priority Data
Dec. 17, 2021 (KR) .................. 10-2021-0181677

(51) Int. Cl.
*H01M 8/04664* (2016.01)
*G01R 31/392* (2019.01)
*H01M 8/04089* (2016.01)
*H01M 8/04537* (2016.01)
*H01M 8/04746* (2016.01)
(Continued)

(52) U.S. Cl.
CPC ...... *H01M 8/04679* (2013.01); *G01R 31/392* (2019.01); *H01M 8/04089* (2013.01); *H01M 8/04559* (2013.01); *H01M 8/04567* (2013.01); *H01M 8/04589* (2013.01); *H01M 8/04753* (2013.01); *H01M 8/04888* (2013.01); *H01M 16/006* (2013.01); *H01M 2250/20* (2013.01)

(58) Field of Classification Search
CPC .............. G01R 31/392; H01M 16/006; H01M 2250/20; H01M 8/04089; H01M 8/043; H01M 8/04395; H01M 8/04552; H01M 8/04559; H01M 8/04567; H01M 8/04589; H01M 8/04679; H01M 8/04686; H01M 8/04753; H01M 8/04783; H01M 8/0488; H01M 8/04888; H01M 8/0491; H01M 8/04947; Y02E 60/50
See application file for complete search history.

(56) References Cited

FOREIGN PATENT DOCUMENTS

| JP | 2013196782 A | * | 9/2013 | .............. H01M 8/04 |
| KR | 10-1847835 B1 | | 4/2018 | |

OTHER PUBLICATIONS

Machine translation JP2013196782 (Year: 2013).*

* cited by examiner

*Primary Examiner* — Victoria H Lynch
(74) *Attorney, Agent, or Firm* — Fox Rothschild LLP

(57) ABSTRACT

Provided are a recovery control system of a fuel cell and a method thereof. The recovery control system includes the fuel cell, a hydrogen supplier configured to supply hydrogen to the fuel cell, an air supplier configured to supply air to the fuel cell, an abnormality sensing unit configured to calculate a difference between a reference cell voltage predetermined depending on an output current of the fuel cell and a measured cell voltage of unit cells and to sense abnormality of air supply to a fuel cell stack based on the calculated difference between the reference cell voltage and the measured cell voltage or change in the difference, and a recovery controller configured to control the air supplier so as to increase a flow rate of air supplied to the fuel cell stack based on the change in the difference, when the abnormality sensing unit senses abnormality of air supply.

18 Claims, 3 Drawing Sheets

(51) Int. Cl.
*H01M 8/04858* (2016.01)
*H01M 16/00* (2006.01)

RECOVERY CONTROL SYSTEM OF FUEL CELL AND METHOD THEREOF

CROSS-REFERENCE TO RELATED APPLICATION

This application is based on and claims under 35 U.S.C. § 119(a) the benefit of Korean Patent Application No. 10-2021-0181677, filed on Dec. 17, 2021, in the Korean Intellectual Property Office, the disclosure of which is incorporated herein by reference in its entirety.

TECHNICAL FIELD

Embodiments of the present disclosure relate to a recovery control system of a fuel cell and a method thereof, and more particularly, to control technology that senses shortage in air supply to a fuel cell and recovers from the shortage in air supply.

BACKGROUND

A fuel cell is a kind of power generator which converts chemical energy produced by oxidation of fuel into electrical energy. The fuel cell is identical to a chemical cell in that the fuel cell fundamentally uses oxidation-reduction reaction, but is different from the chemical cell in that reactants are continuously supplied to the fuel cell from the outside and a reaction product is continuously removed to the outside of a system in contrast to the chemical cell in which a cell reaction occurs in a closed system. Recently, a fuel cell power generation system is being commercialized, and the reaction product of the fuel cell is pure water and thus use of the fuel cell as an energy source of eco-friendly vehicles is being actively researched.

A fuel cell system includes a fuel cell stack configured to generate electrical energy through a chemical reaction, an air supplier configured to supply air to each cathode of the fuel cell stack, and a fuel supplier configured to supply hydrogen to each anode of the fuel cell stack. That is, air including oxygen is supplied to the cathode of the fuel cell stack, and hydrogen is supplied to the anode of the fuel cell stack.

A Proton Exchange Membrane Fuel Cell (PEMFC), which is also known as a Polymer Electrolyte Membrane Fuel Cell, generates electricity through a chemical reaction between oxygen and hydrogen and additionally produces heat and water. The chemical reaction equation of the PEMFC is as follows.

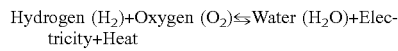

Hydrogen ($H_2$)+Oxygen ($O_2$)⇆Water ($H_2O$)+Electricity+Heat

The fuel cell system of a vehicle performs upper voltage limit control and low flow rate control in a low power section in order to secure durability of the fuel cell stack, and has the power generation stop control function of the fuel cell stack (i.e., in an FC stop mode) in order to improve power generation efficiency.

However, in case that the fuel cell stack is re-operated after the upper voltage limit control and the low flow rate control or the fuel cell stop control of the fuel cell system, air starvation occurs in the fuel cell stack, and thus, the power generation performance of the fuel cell stack is reduced.

In order to solve such air starvation, the above-described conventional fuel cell system senses air starvation using the performance curve (i.e., the current-voltage curve) of the fuel cell stack, and increases a target amount of current for air supply so as to increase the absolute value of the flow rate of supplied air.

However, the conventional fuel cell system diagnoses the performance of only the fuel cell stack, i.e., a single product, and thus cannot reflect an influence on an actual vehicle due to the power generation stop control of the fuel cell or output assistance by a battery. Further, in order to solve such a problem, the flow rate of supplied air is increased or the rising slope of the rotational speed of the air supplier is fixed, and thereby, recovery operation of the fuel cell stack depending on behavior of the fuel cell stack may be fixed.

The above information disclosed in the Background section is only for enhancement of understanding of the background of the disclosure and should not be interpreted as conventional technology that is already known to those skilled in the art.

SUMMARY

Therefore, the present disclosure has been made in view of the above problems, and it is an object of the present disclosure to provide technology regarding recovery control of a fuel cell in which an actual vehicle to which a fuel cell system is applied senses shortage in air supply of the fuel cell and thus increases air supply to the fuel cell.

In one aspect, a recovery control system of a fuel cell, comprising: a) a fuel cell comprising a plurality of unit cells; b) an air supplier configured to supply air to the fuel cell; c) an abnormality sensing unit configured to calculate a difference between a 13 reference cell voltage predetermined depending on an output current of the fuel cell and a measured cell voltage of the unit cells and to sense abnormality of air supply to a fuel cell stack based on the calculated difference between the reference cell voltage and the measured cell voltage or change in the difference between the reference cell voltage and the measured cell voltage; and d) a recovery controller configured to control the air supplier so as to increase a flow rate of air supplied to the fuel cell stack based on the change in the difference between the reference cell voltage and the measured cell voltage, when the abnormality sensing unit senses abnormality of air supply. The system suitably also may comprise a hydrogen supplier unit configured to supply hydrogen to the fuel cell.

In a further aspect, a recovery control system of a fuel cell is provided that comprises: a fuel cell that comprises a plurality of unit cells and configured to generate electric power using supplied hydrogen and air, an air supplier unit configured to supply air to the fuel cell, an abnormality sensing unit configured to calculate a difference between a reference cell voltage predetermined depending on an output current of the fuel cell and a measured cell voltage of the unit cells and to sense abnormality of air supply to a fuel cell stack based on the calculated difference between the reference cell voltage and the measured cell voltage or change in the difference between the reference cell voltage and the measured cell voltage, and a recovery controller configured to control the air supplier so as to increase a flow rate of air supplied to the fuel cell stack based on the change in the difference between the reference cell voltage and the measured cell voltage, when the abnormality sensing unit senses abnormality of air supply. The system suitably also may comprise a hydrogen supplier unit configured to supply hydrogen to the fuel cell.

In some embodiments, the recovery control system may further include a condition determiner configured to determine whether or not a precondition is satisfied based on whether or not the fuel cell is generating power and whether or not the output current of the fuel cell is equal to or less than a predetermined reference current, and the abnormality sensing unit may sense abnormality of air supply when the condition determiner determines that the precondition is satisfied.

In some embodiments, the recovery control system may further include a condition determiner configured to determine whether or not a precondition is satisfied based on whether or not the fuel cell is within a predetermined time after a point in time when stop of power generation of the fuel cell is released, and the abnormality sensing unit may sense abnormality of air supply when the condition determiner determines that the precondition is satisfied.

In some embodiments, the recovery control system may further include a condition determiner configured to determine whether or not a precondition is satisfied based on whether or not the output current of the fuel cell increases, and the abnormality sensing unit may sense abnormality of air supply when the condition determiner determines that the precondition is satisfied.

In some embodiments, the recovery control system may further include a battery charged with the electric power generated by the fuel cell so as to store the electric power, or discharged so as to supplement the electric power generated by the fuel cell, and a converter disposed between the fuel cell and the battery so as to convert the electric power, the abnormality sensing unit may sense abnormality of voltage control of the converter based on the change in the difference between the reference cell voltage and the measured cell voltage when the output current of the fuel cell decreases, and the recovery controller may control the converter so as to increase a fuel cell-side voltage of the converter when the abnormality sensing unit senses abnormality of voltage control.

In some embodiments, the recovery controller may control a rate of increase of a rotational speed of the air supplier by applying a ratio between a previous value and a current value of the difference between the reference cell voltage and the measured cell voltage, when the abnormality sensing unit senses abnormality of air supply.

In some embodiments, the recovery controller may increase a stoichiometric ratio (SR) in air supply by applying a ratio between a target value and a current value of a rotational speed of the air supplier, when the abnormality sensing unit senses abnormality of air supply.

In some embodiments, the recovery controller may increase the stoichiometric ratio (SR) in air supply by applying a ratio between a predetermined reference air pressure and atmospheric pressure.

In accordance with another embodiment of the present disclosure, there is provided a recovery control method of a fuel cell, including calculating a difference between a reference cell voltage predetermined depending on an output current of the fuel cell and a measured cell voltage of unit cells in the fuel cell, sensing abnormality of air supply to a fuel cell stack based on the calculated difference between the reference cell voltage and the measured cell voltage or change in the difference between the reference cell voltage and the measured cell voltage, and controlling an air supplier so as to increase a flow rate of air supplied to the fuel cell stack based on the change in the difference between the reference cell voltage and the measured cell voltage, when abnormality of air supply is sensed.

In some embodiments, the recovery control method may further include determining whether or not a precondition is satisfied based on whether or not the fuel cell is generating power and whether or not the output current of the fuel cell is equal to or less than a predetermined reference current, before the calculating the difference between the reference cell voltage and the measured cell voltage, and, in the calculating the difference between the reference cell voltage and the measured cell voltage, the difference between the reference cell voltage and the measured cell voltage may be calculated upon determining that the precondition is satisfied.

In some embodiments, the recovery control method may further include determining whether or not a precondition is satisfied based on whether or not the fuel cell is within a predetermined time after a point in time when stop of power generation of the fuel cell is released, before the calculating the difference between the reference cell voltage and the measured cell voltage, and, in the calculating the difference between the reference cell voltage and the measured cell voltage, the difference between the reference cell voltage and the measured cell voltage may be calculated upon determining that the precondition is satisfied.

In some embodiments, the recovery control method may further include determining whether or not the output current of the fuel cell increases, before the sensing abnormality of air supply, and, in the sensing abnormality of air supply, abnormality of air supply may be sensed upon determining that the output current of the fuel cell increases.

In some embodiments, the recovery control method may further include, after the determining whether or not the output current of the fuel cell increases, sensing abnormality of voltage control of a converter, disposed between the fuel cell and a battery and configured to convert power, based on the change in the difference between the reference cell voltage and the measured cell voltage when the output current of the fuel cell decreases, and controlling the converter so as to increase a fuel cell-side voltage of the converter when abnormality of voltage control is sensed.

In some embodiments, in the controlling the air supplier, a rate of increase of a rotational speed of the air supplier may be controlled by applying a ratio between a previous value and a current value of the difference between the reference cell voltage and the measured cell voltage.

In some embodiments, in the controlling the air supplier, a stoichiometric ratio (SR) in air supply may be increased by applying a ratio between a target value and a current value of a rotational speed of the air supplier.

In some embodiments, in the controlling the air supplier, the stoichiometric ratio (SR) in air supply may be increased by applying a ratio between a predetermined reference air pressure and atmospheric pressure.

In some embodiments, the stoichiometric ratio (SR) may be a ratio between an oxygen amount depending on the output current of the fuel cell and an oxygen amount supplied to the fuel cell.

As discussed, the method and system suitably include use of a controller or processor.

In another embodiment, vehicles are provided that comprise an apparatus as disclosed herein. The vehicles may further comprise a load device which is electrically connected to the fuel cell.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
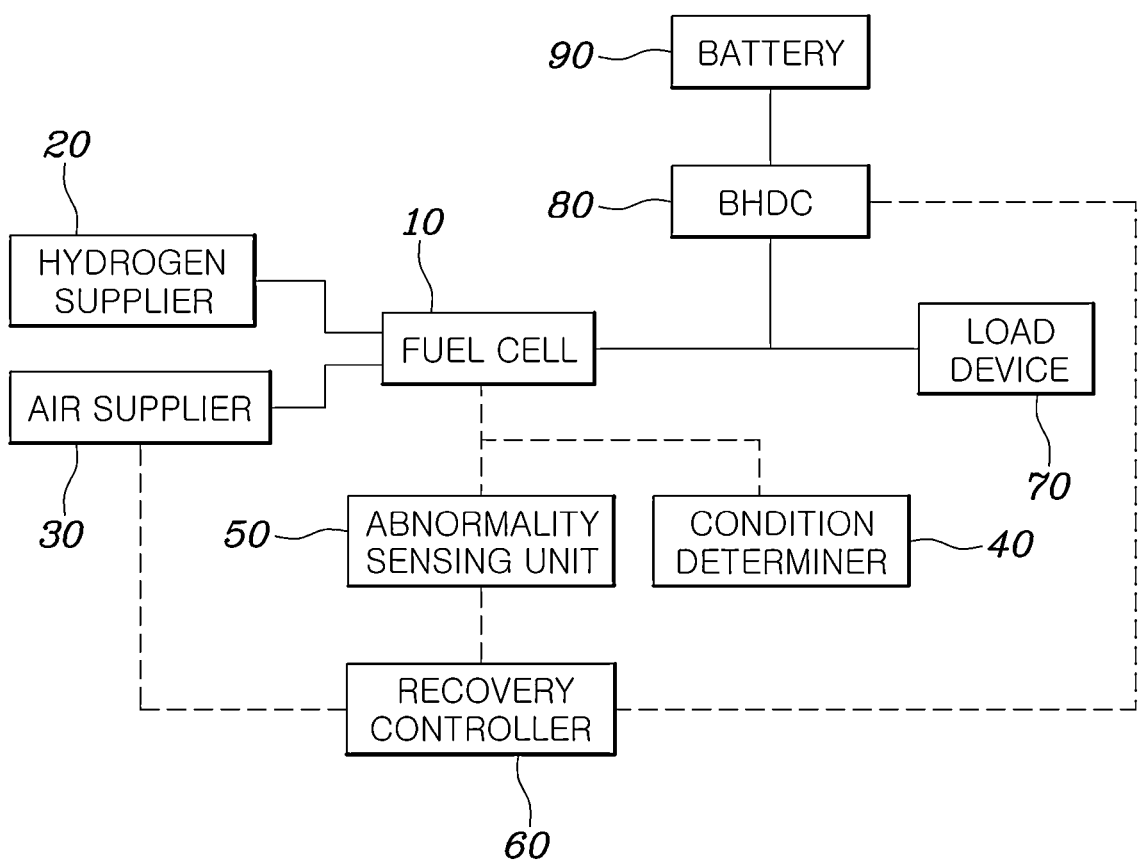
FIG. 1 is a block diagram of a recovery control system of a fuel cell according to one embodiment of the present disclosure.

Specific structural or functional descriptions in embodiments of the present disclosure set forth in the description which follows will be exemplarily given to describe the embodiments of the present disclosure. However, the present disclosure may be embodied in many alternative forms, and should not be construed as being limited to the embodiments set forth herein.

The embodiments of the present disclosure may be variously modified and changed, and thus specific embodiments of the present disclosure will be illustrated in the drawings and described in detail in the following description of the embodiments of the present disclosure. However, it will be understood that the embodiments of the present disclosure are provided only to completely disclose the disclosure and cover modifications, equivalents or alternatives which come within the scope and technical range of the disclosure.

In the following description of the embodiments, terms, such as "first" and "second", are used only to describe various elements, and these elements should not be construed as being limited by these terms. These terms are used only to distinguish one element from other elements. For example, a first element described hereinafter may be termed a second element, and similarly, a second element described hereinafter may be termed a first element, without departing from the scope of the disclosure.

When an element or layer is referred to as being "connected to" or "coupled to" another element or layer, it may be directly connected or coupled to the other element or layer, or intervening elements or layers may be present. In contrast, when an element or layer is referred to as being "directly connected to" or "directly coupled to" another element or layer, there may be no intervening elements or layers present. Other words used to describe relationships between elements should be interpreted in a like fashion, e.g., "between" versus "directly between," "adjacent" versus "directly adjacent," etc.

The terminology used herein is for the purpose of describing particular embodiments only and is not intended to be limiting. As used herein, singular forms may be intended to include plural forms as well, unless the context clearly indicates otherwise. The terms "comprises," "comprising," "including," and "having" are inclusive and therefore specify the presence of stated features, integers, steps, operations, elements, components, and/or combinations thereof, but do not preclude the presence or addition of one or more other features, integers, steps, operations, elements, components, and/or combinations thereof.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. These terms are merely intended to distinguish one component from another component, and the terms do not limit the nature, sequence or order of the constituent components. It will be further understood that the terms "comprises" and/or "comprising," when used in this specification, specify the presence of stated features, integers, steps, operations, elements, and/or components, u but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Unless defined otherwise, all terms including technical and scientific terms used in the following description have the same meanings as those of terms generally understood by those skilled in the art. Terms defined in generally used dictionaries will be interpreted as having meanings coinciding with contextual meanings in the related technology, and are not to be interpreted as having ideal or excessively formal meanings unless defined clearly in the description.

Hereinafter, reference will now be made in detail to the exemplary embodiments of the present disclosure, examples of which are illustrated in the accompanying drawings. Wherever possible, the same reference numbers will be used throughout the drawings to refer to the same or like parts.

FIG. 1 is a block diagram of a recovery control system of a fuel cell 10 according to one embodiment of the present disclosure.

Referring to FIG. 1, the recovery control system of the fuel cell 10 according to one embodiment of the present disclosure may include the fuel cell 10 including a plurality of unit cells and configured to generate electric power using supplied hydrogen and air, a hydrogen supplier 20 configured to supply hydrogen to the fuel cell 10, an air supplier 30 configured to supply air to the fuel cell 10, an abnormality sensing unit 50 configured to calculate a difference between a reference cell voltage predetermined depending on the output current of the fuel cell 10 and a measured cell voltage of the unit cells and to sense abnormality of air supply to of a fuel cell stack based on the calculated difference between the reference cell voltage and the measured cell voltage or change in the difference between the reference cell voltage and the measured cell voltage, and a recovery controller 60 configured to control the air supplier 30 so as to increase the flow rate of air supplied to the fuel cell stack based on the change in the difference between the reference cell voltage and the measured cell voltage, when the abnormality sensing unit 50 senses abnormality of air supply.

The fuel cell 10 may be a fuel cell stack 10 in which a plurality of cells is stacked, and each of the unit cells included in the fuel cell stack 10 may generate power using hydrogen supplied to an anode and air including oxygen supplied to a cathode.

The fuel cell 10 may include membrane electrode assemblies (MEAs).

A load device 70 may be a power consumption device which is electrically connected to the fuel cell 10, and may receive power generated by the fuel cell 10. Particularly, the load device 70 may receive most of demanded power from the fuel cell 10, and a battery 90 may serve as an energy buffer which supplements the shortage of power or stores surplus power.

In one embodiment, the load device 70 may be a driving motor of a vehicle, the air supplier 30, such as an air blower or an air compressor, configured to supply air to the fuel cell stack 10, a cooling pump configured to supply a coolant to cool the fuel cell stack 10, or a power consumption device, such as a COD resistor.

The fuel cell 10 and the load device 70 may be connected by a main bus terminal, and the battery 90 disposed between the fuel cell 10 and the load device 70 may be connected to the fuel cell 10 and the load device 70 through a converter 80. The converter 80 may be a Bidirectional High voltage DC/DC Converter (BHDC) which performs bidirectional power conversion so as to charge or discharge the battery 90. The battery 90 may include a plurality of cells, and may be charged with power or be discharged.

The hydrogen supplier 20 may supply hydrogen to the plurality of unit cells included in the fuel cell 10. Particularly, the hydrogen supplier 20 may consistently supply hydrogen to the fuel cell 10. In one embodiment, the hydrogen supplier 20 may include a recirculation line configured to recirculate gas including hydrogen to the anode of the fuel cell 10, a storage tank configured to store hydrogen, and an ejector provided between the recirculation line and the storage tank and configured to generate recirculation power.

The air supplier 30 may supply air including oxygen to the plurality of unit cells included in the fuel cell 10. Particularly, the air supplier 30 may selectively supply air to the fuel cell 10. More specifically, the air supplier 30 may stop air supply in the power generation stop state (i.e., the FC stop state) of the fuel cell 10, and may supply air only in the power generation state of the fuel cell 10. Further, the air supplier 30 may adjust the amount of air supplied to the fuel cell 10 in the upper voltage limit control state and the low flow rate control state of the fuel cell 10.

In one embodiment, the air supplier 30 may include an air supply line connected to the outside and an air blower or an air compressor configured to allow air to flow, and may further include a pressure control valve provided on an air discharge line.

The abnormality sensing unit 50 may calculate the difference between the predetermined reference cell voltage and the measured cell voltage of the unit cells. In one embodiment, the abnormality sensing unit 50 may calculate a value (Δcell voltage) by subtracting the measured cell voltage from the reference cell voltage.

Here, the reference cell voltage may be predetermined depending on the output current of the fuel cell 10, and the reference cell voltage may be an average value between the performance of the fuel cell 10 at the Birth Of Life (BOL) when the fuel cell 10 is released from a factory and the performance of the fuel cell 10 at the End Of Life (EOL) when the fuel cell 10 needs to be replaced, and may be predetermined from a table or a map depending on the output current of the fuel cell 10.

The measured cell voltage may be the sensed value of the output voltage of the unit cells of the fuel cell 10, and may be directly acquired by measuring the output voltage of the unit cells using a voltage sensor, or may be indirectly acquired by dividing the output voltage of the fuel cell 10 by the number of the unit cells.

Further, the abnormality sensing unit 50 may sense abnormality of air supply to the fuel cell stack 10 based on the calculated difference between the reference cell voltage and the measured cell voltage or change in the difference between the reference cell voltage and the measured cell voltage.

In one embodiment, the abnormality sensing unit 50 may determine that abnormality of air supply to the fuel cell stack 10 occurs, when the calculated difference between the reference cell voltage and the measured cell voltage is greater than 0 (reference cell voltage>measured cell voltage).

Further, the abnormality sensing unit 50 may determine that abnormality of air supply to the fuel cell stack 10 occurs, when the calculated difference between the reference cell voltage and the measured cell voltage increases ($\Delta$cell voltage$_N$>$\Delta$cell voltage$_{N-1}$). In this case, the recovery controller 60 may control the air supplier 30 so as to immediately increase the flow rate of air supplied to the fuel cell stack 10.

In another embodiment, the abnormality sensing unit 50 may determine that abnormality of air supply to the fuel cell stack 10 occurs, when the calculated difference between the reference cell voltage and the measured cell voltage is greater than 0 (reference cell voltage>measured cell voltage), although the calculated difference between the reference cell voltage and the measured cell voltage does not continuously increase.

The recovery controller 60 may control the air supplier 30 so as to increase the flow rate of air supplied to the fuel cell stack 10 when the abnormality sensing unit 50 senses abnormality of air supply.

Particularly, the recovery controller 60 may not increase the absolute value of the flow rate of air supplied to the fuel cell stack 10 simply when abnormality of air supply is sensed, and may increase the flow rate of air supplied to the fuel cell stack 10 based on the change in the calculated difference between the reference cell voltage and the measured cell voltage.

The abnormality sensing unit 50, the recovery controller 60 and a condition determiner 40 according to exemplary embodiments of the present disclosure may be implemented through a non-volatile memory (not shown) configured to store an algorithm configured to control operations of various elements of a vehicle or data regarding software commands for reproducing the algorithm and a processor (not shown) configured to perform operations which will be described below using data stored in the corresponding memory. Here, the memory and the processor may be implemented as individual chips. Alternatively, the memory and the processor may be implemented as a single integrated chip. The processor may be provided in the form of one or more processors.

Based on recovery control according to the present disclosure, air supply to the fuel cell stack 10 may be increased by reflecting behavior of the fuel cell stack 10 depending on drop of the output voltage of the fuel cell stack 10 or the cell voltage, thereby being capable of improving recovery performance.

Figure 2:
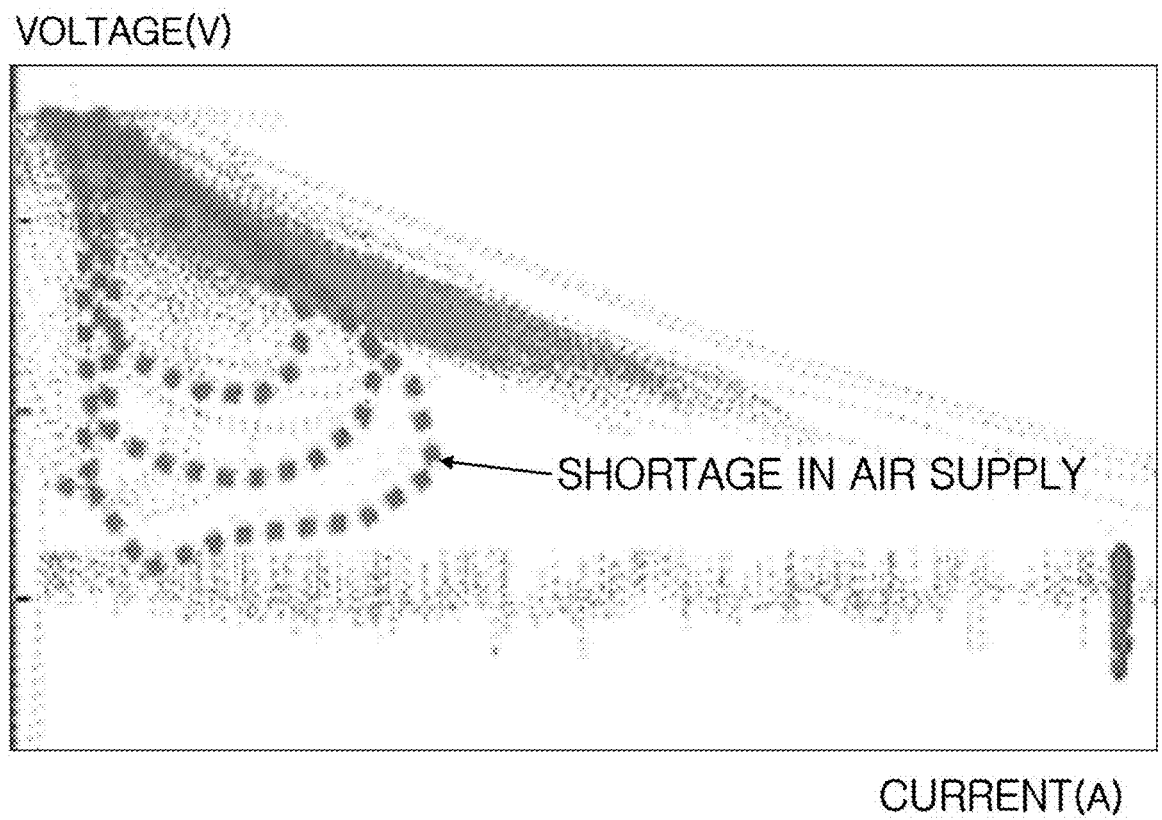
FIG. 2 is a current-voltage curve (I-V curve) caused by shortage in air supply to the fuel cell.

FIG. 2 is a current-voltage curve (I-V curve) caused by shortage in air supply to the fuel cell 10.

Referring to FIG. 2, the I-V curve of the fuel cell 10 shows that the output voltage of the fuel cell 10 tends to decrease as the output current of the fuel cell 10 increases, and the output current of the fuel cell 10 tends to decrease as the output voltage of the fuel cell 10 increases.

However, as shown in this figure, when shortage in air supply to the fuel cell 10 occurs, a cell voltage sag or a cell voltage dip in which the output voltage or the cell voltage of the fuel cell stack 10 rapidly drops occurs.

The recovery control system of the fuel cell 10 according to the present disclosure may further include the condition determiner 40 configured to determine whether or not a precondition is satisfied based on whether or not the fuel cell 10 is generating power and whether or not the output current of the fuel cell 10 is equal to or less than a predetermined reference current, and the abnormality sensing unit 50 may sense abnormality of air supply when the condition determiner 40 determines that the precondition is satisfied.

The condition determiner 40 may determine whether or not the precondition is satisfied by determining the precondition before the abnormality sensing unit 50 senses abnormality of air supply. More specifically, the condition determiner 40 may determine that the precondition is satisfied, when it is determined that the fuel cell 10 is generating power.

On the other hand, when it is determined that the fuel cell 10 stops power generation (i.e., in the FC stop state or in a system termination state), the condition determiner 40 may determine that it is not necessary to sense abnormality of air supply, and may thus determine that the precondition is not satisfied.

Further, the condition determiner 40 may determine whether or not the precondition is satisfied by determining whether or not the output current of the fuel cell 10 is equal to or less than the predetermined reference current. Specifically, the condition determiner 40 may determine that the precondition is satisfied when the output current of the fuel cell 10 is equal to or less than the predetermined reference current.

That is, the condition determiner 40 may determine that the precondition is satisfied only in the upper voltage limit control state in which the unit cells of the fuel cell 10 maintain voltage so as not to be exposed to high voltage or in the low flow rate control state in which the flow rate of air supplied to the fuel cell 10 is reduced.

In another embodiment, the recovery control system of the fuel cell 10 according to the present disclosure may further include the condition determiner 40 configured to determine whether or not a precondition is satisfied based on whether or not the fuel cell 10 is within a predetermined time after a point in time when stop of power generation of the fuel cell 10 is released, and the abnormality sensing unit 50 may sense abnormality of air supply when the condition determiner 40 determines that the precondition is satisfied.

That is, at the time when the power generation stop state of the fuel cell 10 is released and thus the fuel cell 10 is reoperated, the amount of air supplied to the fuel cell 10 is insufficient, and therefore, the condition determiner 40 may determine that the precondition is satisfied at this time.

Further, the recovery control system of the fuel cell 10 according to the present disclosure may further include the condition determiner 40 configured to determine whether or not a precondition is satisfied based on whether or not the output current increases, and the abnormality sensing unit 50 may sense abnormality of air supply when the condition determiner 40 determines that the precondition is satisfied.

Specifically, the condition determiner 40 may determine whether or not the output current of the fuel cell 10 increases using change in the output current of the fuel cell 10 (the current value−the previous value of the output current of the fuel cell 10, i.e., ΔFC current), and may determine that the precondition is satisfied upon determining that the output current of the fuel cell 10 increases.

Therefore, abnormality of air supply to the fuel cell stack 10 may be accurately sensed by reflecting behavior of the fuel cell stack 10 depending on the operation state of the entirety of the system including the fuel cell stack 10.

In addition, the recovery control system of the fuel cell 10 according to the present disclosure may further include the battery 90 charged with power generated by the fuel cell 10 so as to store the generated power or discharged so as to supplement the power generated by the fuel cell 10, and the converter 80 disposed between the fuel cell 10 and the battery 90 so as to convert power, the abnormality sensing unit 50 may sense abnormality of voltage control of the converter 80 based on change in the difference between the reference cell voltage and the measured cell voltage when the output current of the fuel cell 10 decreases, and the recovery controller 60 may control the converter 80 so as to increase the fuel cell-side voltage of the converter 80 when the abnormality sensing unit 50 senses abnormality of voltage control.

The condition determiner 40 may determine whether or not the output current of the fuel cell 10 increases using change in the output current of the fuel cell 10 (the current value−the previous value of the output current of the fuel cell 10, i.e., ΔFC current), and may sense abnormality of voltage control of the converter 80 upon determining that the output current of the fuel cell 10 decreases.

More specifically, there may be a case that the performance curve (the current-voltage curve) of the fuel cell 10 exhibits abnormal behavior due to decrease in the voltage of the converter 80 to 360 V when power generation of the fuel cell 10 is stopped, and in this case, the output current of the fuel cell 10 decreases and the difference between the reference cell voltage and the measured cell voltage remains constant.

The recovery controller 60 may control the converter 80 so as to increase the fuel cell-side voltage of the converter 80 when the abnormality sensing unit 50 senses abnormality of voltage control. That is, the recovery controller 60 may control the converter 80 so as to increase the fuel cell-side voltage or the reference voltage of the converter 80 when the abnormality sensing unit 50 senses abnormality of voltage control.

The recovery controller 60 may control the rate of increase in the rotational speed of the air supplier 30 by applying a ratio between the previous value and the current value of the difference between the reference cell voltage and the measured cell voltage, when the abnormality sensing unit 50 senses abnormality of air supply.

In one embodiment, the recovery controller 60 may control the rising slope (i.e., the rate of increase) of the flow rate of air supplied to the fuel cell 10 using change in the calculated difference between the reference cell voltage and the measured cell voltage. Specifically, the recovery controller 60 may control the rate of increase of the flow rate of air by applying the ratio ($\Delta$cell voltage$_N$/$\Delta$cell voltage$_{N-1}$) between the previous value ($\Delta$cell voltage$_{N-1}$) and the current value ($\Delta$cell voltage$_N$) of the difference between the reference cell voltage and the measured cell voltage to a predetermined basic rate of rise.

Particularly, the recovery controller 60 may control the rate of increase of the rotational speed of the air supplier 30, in order to control the rate of increase of the flow rate of air.

More specifically, the recovery controller 60 may control the rate of increase of the flow rate of air or the rate of increase of the rotational speed of the air supplier 30 using the following Equation. Here, the predetermined basic rate of rise is set to 1.2.

$$\text{slewrate}_N = \text{slewrate}_{N-1} \times \Delta\text{cell voltage}_N / \Delta\text{cell voltage}_{N-1} \times 1.2$$

Further, the recovery controller 60 may increase a stoichiometric ratio (SR) in air supply by applying a ratio between the target value and the current value of the rotational speed of the air supplier 30, when the abnormality sensing unit 50 senses abnormality of air supply.

Specifically, the stoichiometric ratio (SR) in air supply may be a ratio between an oxygen amount depending on the demanded output current of the fuel cell 10 and an oxygen amount supplied to the fuel cell 10. That is, the increase in the stoichiometric ratio (SR) in air supply means indirect increase in the amount of air supplied to the fuel cell 10.

Further, the recovery controller 60 may increase the stoichiometric ratio (SR) in air supply by applying a ratio between a predetermined reference air pressure and atmospheric pressure.

More specifically, the recovery controller 60 may set the stoichiometric ratio (SR) in air supply using the following equation. Here, the predetermined basic rate of rise is set to 1.2, RPM$_{target}$ and RPM$_{est}$ indicate the target value and the current value of the rotational speed of the air supplier 30, respectively, and a correction factor of 0.98 is applied to the current value of the rotational speed of the air supplier 30. Further, the predetermined reference air pressure is set to 100 kPa, and AP indicates the atmospheric pressure in the current state.

$$SR_N = SR_{N-1} \times RPM_{target}/RPM_{est} \times 0.98 \times 1.2 \times 100\ [kPa]/AP$$

Therefore, the recovery controller 60 may indirectly increase the flow rate of air supplied to the fuel cell 10, and may set the stoichiometric ratio (SR) by reflecting the operating rate of the air supplier 30 and change in the atmospheric pressure depending on the altitude of the vehicle.

Figure 3:
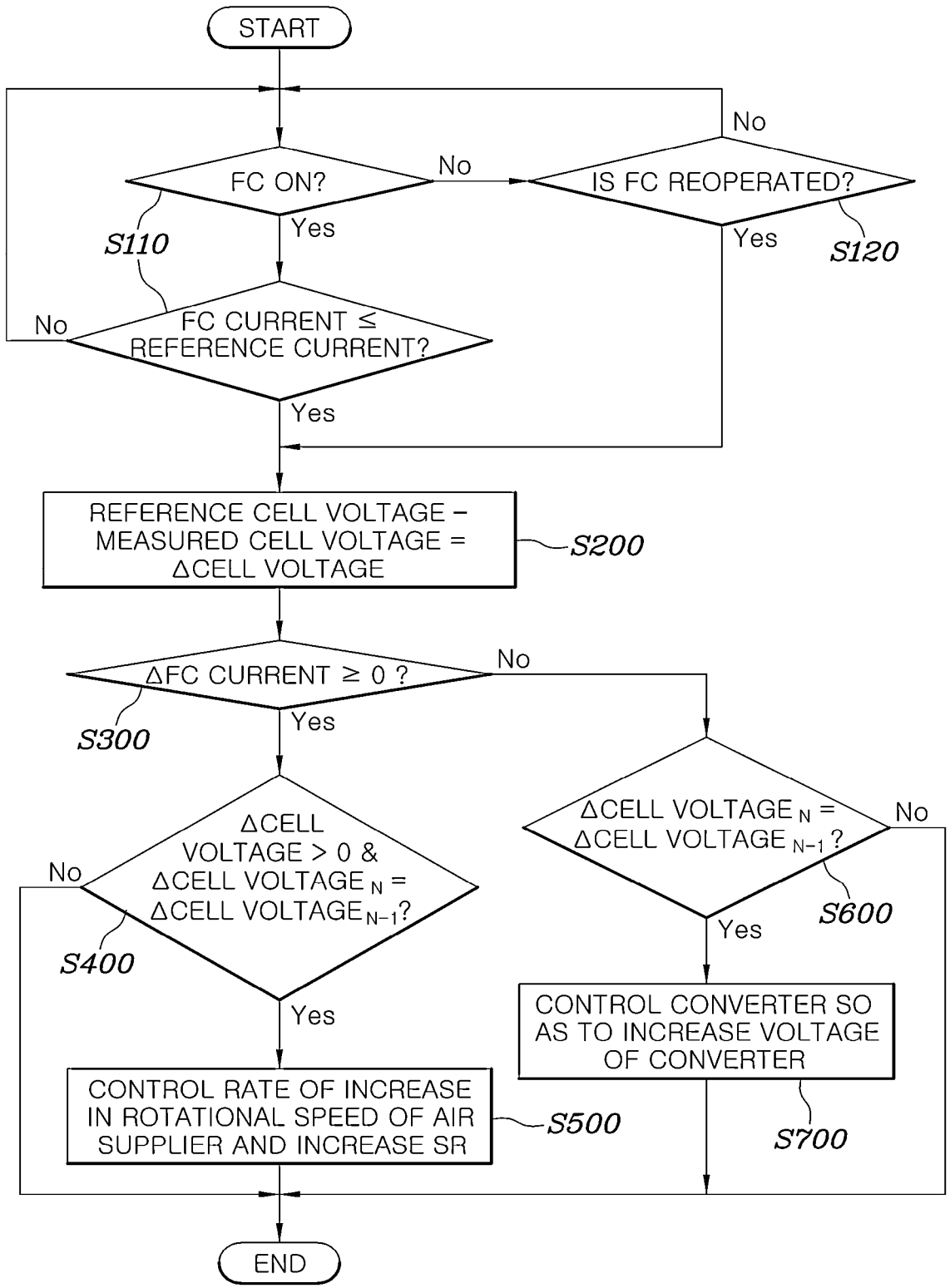
FIG. 3 is a flowchart representing a recovery control method of a fuel cell according to one embodiment of the present disclosure.

FIG. 3 is a flowchart representing a recovery control method of the fuel cell 10 according to one embodiment of the present disclosure.

Referring to FIG. 3, the recovery control method of the fuel cell 10 according to one embodiment of the present disclosure may include measuring a difference between a reference cell voltage predetermined depending on the output current of the fuel cell 10 and a measured cell voltage of the unit cells included in the fuel cell 10 (S200), sensing abnormality of air supply to the fuel cell stack 10 based on the calculated difference between the reference cell voltage and the measured cell voltage or change in the difference between the reference cell voltage and the measured cell voltage (S400), and controlling the air supplier 30 so as to increase the flow rate of air supplied to the fuel cell stack 10 based on the change in the difference between the reference cell voltage and the measured cell voltage, when abnormality of air supply is sensed (S500).

The recovery control method of the fuel cell 10 according to one embodiment of the present disclosure may further include determining whether or not a precondition is satisfied (S100) based on whether or not the fuel cell 10 is generating power and whether or not the output current of the fuel cell 10 is equal to or less than a predetermined reference current (S110), before the calculating the difference between the reference cell voltage and the measured cell voltage (S200), and, in the calculating the difference between the reference cell voltage and the measured cell voltage (S200), the difference between the reference cell voltage and the measured cell voltage may be calculated upon determining that the precondition is satisfied.

The recovery control method of the fuel cell 10 according to one embodiment of the present disclosure may further include determining whether or not a precondition is satisfied (S100) based on whether or not the fuel cell 10 is within a predetermined time after a point in time when stop of power generation of the fuel cell 10 is released (S120), before the calculating the difference between the reference cell voltage and the measured cell voltage (S200), and, in the calculating the difference between the reference cell voltage and the measured cell voltage (S200), the difference between the reference cell voltage and the measured cell voltage may be calculated upon determining that the precondition is satisfied.

The recovery control method of the fuel cell 10 according to one embodiment of the present disclosure may further include determining whether or not the output current of the fuel cell 10 increases (S300), before the sensing abnormality of air supply (S400), and, in the sensing abnormality of air supply (S400), abnormality of air supply may be sensed upon determining that the output current of the fuel cell 10 increases.

The recovery control method of the fuel cell 10 according to one embodiment of the present disclosure may further include sensing abnormality of voltage control of the converter 80, disposed between the fuel cell 10 and the battery 90 and configured to convert power, based on the change in the difference between the reference cell voltage and the measured cell voltage when the output current of the fuel cell 10 decreases (S600), and controlling the converter 80 so as to increase the fuel cell-side voltage of the converter 80 when abnormality of voltage control is sensed (S700), after the determining whether or not the output current of the fuel cell 10 increases (S300).

In the controlling the air supplier 30 (S500), the rate of increase of the rotational speed of the air supplier 30 may be controlled by applying a ratio between the previous value and the current value of the difference between the reference cell voltage and the measured cell voltage.

In the controlling the air supplier 30 (S500), a stoichiometric ratio (SR) in air supply may be increased by applying a ratio between the target value and the current value of the rotational speed of the air supplier 30.

In the controlling the air supplier 30 (S500), the stoichiometric ratio (SR) in air supply may be increased by applying a ratio between a predetermined reference air pressure and atmospheric pressure.

As is apparent from the above description, a recovery control system and method of a fuel cell according to the present disclosure may accurately sense abnormality of air supply to a fuel cell stack by reflecting behavior of the fuel cell stack depending on the operating state of the entirety of the system including the fuel cell stack.

Further, air supply to the fuel cell stack may be increased by reflecting behavior of the fuel cell stack depending on the drop of the output voltage or cell voltage of the fuel cell stack, thereby improving recovery performance.

Although the exemplary embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A recovery control system of a fuel cell, comprising:
a) a fuel cell comprising a plurality of unit cells;
b) an air supplier configured to supply air to the fuel cell;
c) an abnormality sensing unit configured to calculate a difference between a reference cell voltage predetermined depending on an output current of the fuel cell and a measured cell voltage of the plurality of unit cells and to sense abnormality of air supply to a fuel cell stack based on the calculated difference between the reference cell voltage and the measured cell voltage or change in the difference between the reference cell voltage and the measured cell voltage; and
d) a recovery controller configured to control the air supplier so as to increase a flow rate of air supplied to the fuel cell stack based on the change in the difference between the reference cell voltage and the measured cell voltage, when the abnormality sensing unit senses abnormality of air supply;
wherein the recovery controller controls a rate of increase of a rotational speed of the air supplier by applying a ratio between a previous value and a current value of the difference between the reference cell voltage and the measured cell voltage, when the abnormality sensing unit senses abnormality of air supply.

2. The recovery control system according to claim 1, further comprising a hydrogen supplier configured to supply hydrogen to the fuel cell.

3. The recovery control system according to claim 1, further comprising:
a condition determiner configured to determine whether or not a precondition is satisfied based on whether or not the fuel cell is generating power and whether or not the output current of the fuel cell is equal to or less than a predetermined reference current,
wherein the abnormality sensing unit senses abnormality of air supply when the condition determiner determines that the precondition is satisfied.

4. The recovery control system according to claim 1, further comprising:
a condition determiner configured to determine whether or not a precondition is satisfied based on whether or not the fuel cell is within a predetermined time after a point in time when stop of power generation of the fuel cell is released,
wherein the abnormality sensing unit senses abnormality of air supply when the condition determiner determines that the precondition is satisfied.

5. The recovery control system according to claim 1, further comprising:
a condition determiner configured to determine whether or not a precondition is satisfied based on whether or not the output current of the fuel cell increases,
wherein the abnormality sensing unit senses abnormality of air supply when the condition determiner determines that the precondition is satisfied.

6. The recovery control system according to claim 1, wherein the recovery controller increases a stoichiometric ratio (SR) in air supply by applying a ratio between a target value and a current value of a rotational speed of the air supplier, when the abnormality sensing unit senses abnormality of air supply.

7. The recovery control system according to claim 6, wherein the stoichiometric ratio (SR) is a ratio between an oxygen amount depending on the output current of the fuel cell and an oxygen amount supplied to the fuel cell.

8. The recovery control system according to claim 6, wherein the recovery controller increases the stoichiometric ratio (SR) in air supply by applying a ratio between a predetermined reference air pressure and atmospheric pressure.

9. A vehicle comprising the recovery control system of claim 1, and the vehicle optionally further comprising a load device electrically connected to the fuel cell.

10. A recovery control system of a fuel cell, comprising:
a) a fuel cell comprising a plurality of unit cells;
b) an air supplier configured to supply air to the fuel cell;
c) an abnormality sensing unit configured to calculate a difference between a reference cell voltage redetermined depending on an output current of the fuel cell and a measured cell voltage of the plurality of unit cells and to sense abnormality of air supply to a fuel cell stack based on the calculated difference between the reference cell voltage and the measured cell voltage or change in the difference between the reference cell voltage and the measured cell voltage; and
d) a recovery controller configured to control the air supplier so as to increase a flow rate of air supplied to the fuel cell stack based on the change in the difference between the reference cell voltage and the measured cell voltage, when the abnormality sensing unit senses abnormality of air supply;
a battery charged with the electric power generated by the fuel cell so as to store the electric power, or discharged so as to supplement the electric power generated by the fuel cell; and
a converter disposed between the fuel cell and the battery so as to convert the electric power, wherein:
the abnormality sensing unit senses abnormality of voltage control of the converter based on the change in the difference between the reference cell voltage and the measured cell voltage when the output current of the fuel cell decreases; and
the recovery controller controls the converter so as to increase a fuel cell-side voltage of the converter when the abnormality sensing unit senses abnormality of voltage control.

11. A recovery control method of a fuel cell, comprising:
calculating a difference between a reference cell voltage predetermined depending on an output current of the fuel cell and a measured cell voltage of unit cells in the fuel cell;
sensing abnormality of air supply to a fuel cell stack based on the calculated difference between the reference cell voltage and the measured cell voltage or change in the difference between the reference cell voltage and the measured cell voltage; and
controlling an air supplier so as to increase a flow rate of air supplied to the fuel cell stack based on the change in the difference between the reference cell voltage and the measured cell voltage, when abnormality of air supply is sensed;
wherein, in the controlling the air supplier, a rate of increase of a rotational speed of the air supplier is controlled by applying a ratio between a previous value and a current value of the difference between the reference cell voltage and the measured cell voltage.

12. The recovery control method according to claim 11, further comprising determining whether or not a precondition is satisfied based on whether or not the fuel cell is generating power and whether or not the output current of the fuel cell is equal to or less than a predetermined reference current, before the calculating the difference between the reference cell voltage and the measured cell voltage,
wherein, in the calculating the difference between the reference cell voltage and the measured cell voltage, the difference between the reference cell voltage and the measured cell voltage is calculated upon determining that the precondition is satisfied.

13. The recovery control method according to claim 11, further comprising determining whether or not a precondition is satisfied based on whether or not the fuel cell is within a predetermined time after a point in time when stop of power generation of the fuel cell is released, before the calculating the difference between the reference cell voltage and the measured cell voltage,
wherein, in the calculating the difference between the reference cell voltage and the measured cell voltage, the difference between the reference cell voltage and the measured cell voltage is calculated upon determining that the precondition is satisfied.

14. The recovery control method according to claim 11, further comprising determining whether or not the output current of the fuel cell increases, before the sensing abnormality of air supply,
wherein, in the sensing abnormality of air supply, abnormality of air supply is sensed upon determining that the output current of the fuel cell increases.

15. The recovery control method according to claim 14, further comprising, after the determining whether or not the output current of the fuel cell increases:
sensing abnormality of voltage control of a converter, disposed between the fuel cell and a battery and configured to convert power, based on the change in the difference between the reference cell voltage and the measured cell voltage when the output current of the fuel cell decreases; and
controlling the converter so as to increase a fuel cell-side voltage of the converter when abnormality of voltage control is sensed.

16. The recovery control method according to claim 11, wherein, in the controlling the air supplier, a stoichiometric ratio (SR) in air supply is increased by applying a ratio between a target value and a current value of a rotational speed of the air supplier.

17. The recovery control method according to claim 16, wherein the stoichiometric ratio (SR) is a ratio between an oxygen amount depending on the output current of the fuel cell and an oxygen amount supplied to the fuel cell.

18. The recovery control method according to claim 16, wherein, in the controlling the air supplier, the stoichiometric ratio (SR) in air supply is increased by applying a ratio between a predetermined reference air pressure and atmospheric pressure.

* * * * *